United States Patent [19]
Kihara et al.

[11] Patent Number: 5,889,504
[45] Date of Patent: Mar. 30, 1999

[54] SHIFT REGISTER CIRCUIT AND DISPLAY UNIT INCORPORATING THE SAME

[75] Inventors: Katsuya Kihara, Kobe; Atsushi Wada, Ogaki; Masayuki Koga, Nishinomiya, all of Japan

[73] Assignee: Sanyo Electric Co., Ltd., Osaka, Japan

[21] Appl. No.: 564,414

[22] Filed: Nov. 29, 1995

[30] Foreign Application Priority Data

Nov. 29, 1994 [JP] Japan .................................. 6-295029
Aug. 4, 1995 [JP] Japan .................................. 7-200052

[51] Int. Cl.[6] .................................................. G09G 3/18
[52] U.S. Cl. ........................... 345/100; 345/93; 327/526; 377/64
[58] Field of Search .................................. 377/64, 67, 69; 365/78; 345/87, 92, 93, 100; 349/42; 327/526

[56] References Cited

U.S. PATENT DOCUMENTS

| | | | |
|---|---|---|---|
| 4,995,703 | 2/1991 | Noguchi | 345/93 |
| 5,063,378 | 11/1991 | Roach | 345/93 |
| 5,103,218 | 4/1992 | Takeda | 345/100 |
| 5,198,999 | 3/1993 | Abe et al. | 377/67 |
| 5,465,053 | 11/1995 | Edwards | 345/93 |
| 5,534,885 | 7/1996 | Saitoh | 345/100 |

*Primary Examiner*—Lun-Yi Lao
*Attorney, Agent, or Firm*—Sheridan Ross P.C.

[57] ABSTRACT

A shift register circuit includes a plurality of shift register blocks and a plurality of connecting sections that belong to a plurality of signal shifting systems. Each of the shift register blocks includes a plurality of shift register groups, each of which belongs to the plurality of signal shifting systems. Each of the connecting sections is provided to mutually connect the shift register groups belonging to the associated signal shifting system. The plurality of shift register blocks and the plurality of connecting sections are arranged in a line in the shift register circuit. Further, the plurality of connecting sections are separated by at least two connecting section groups in that line arrangement with at least one of the shift register blocks located between the connecting section groups.

16 Claims, 10 Drawing Sheets

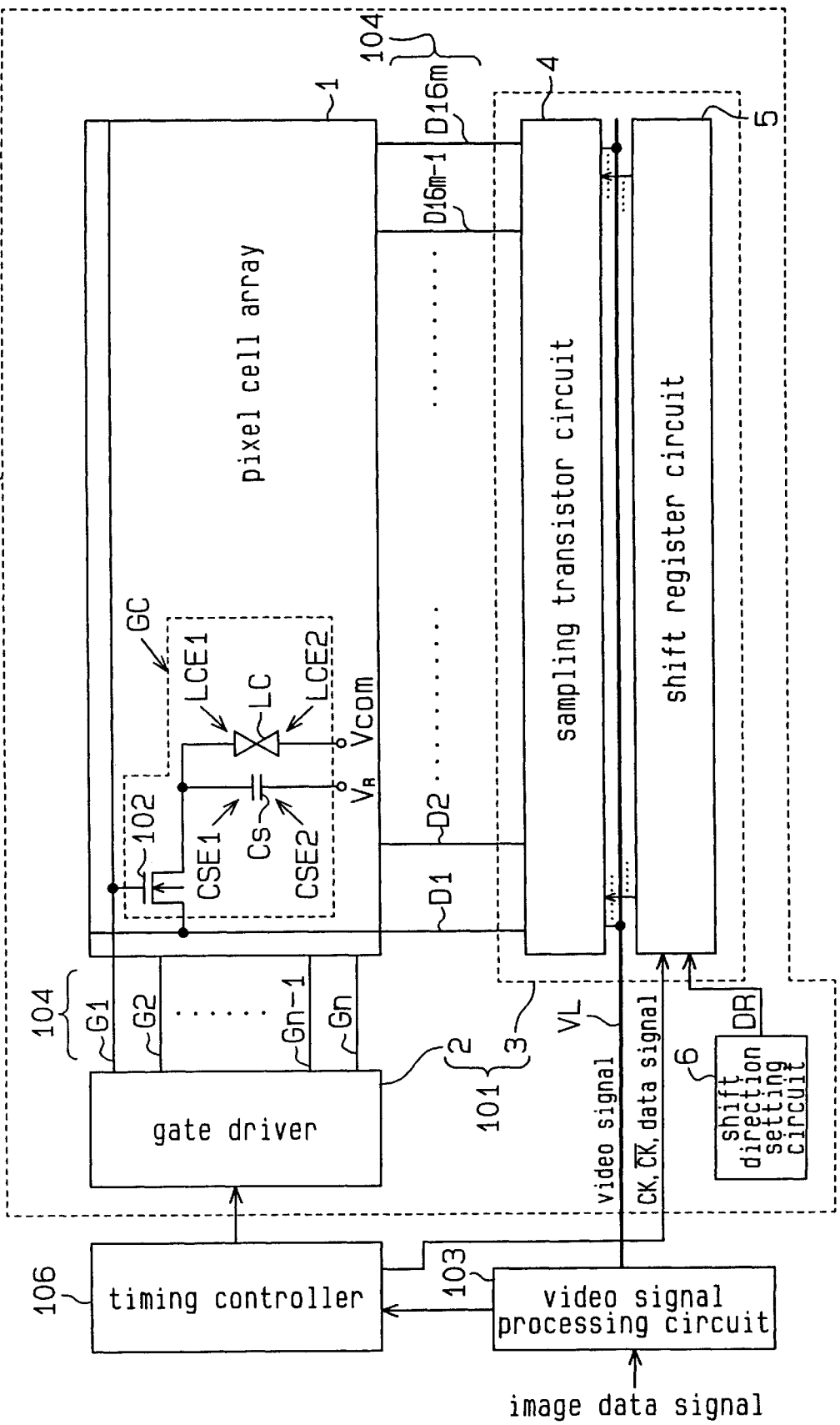

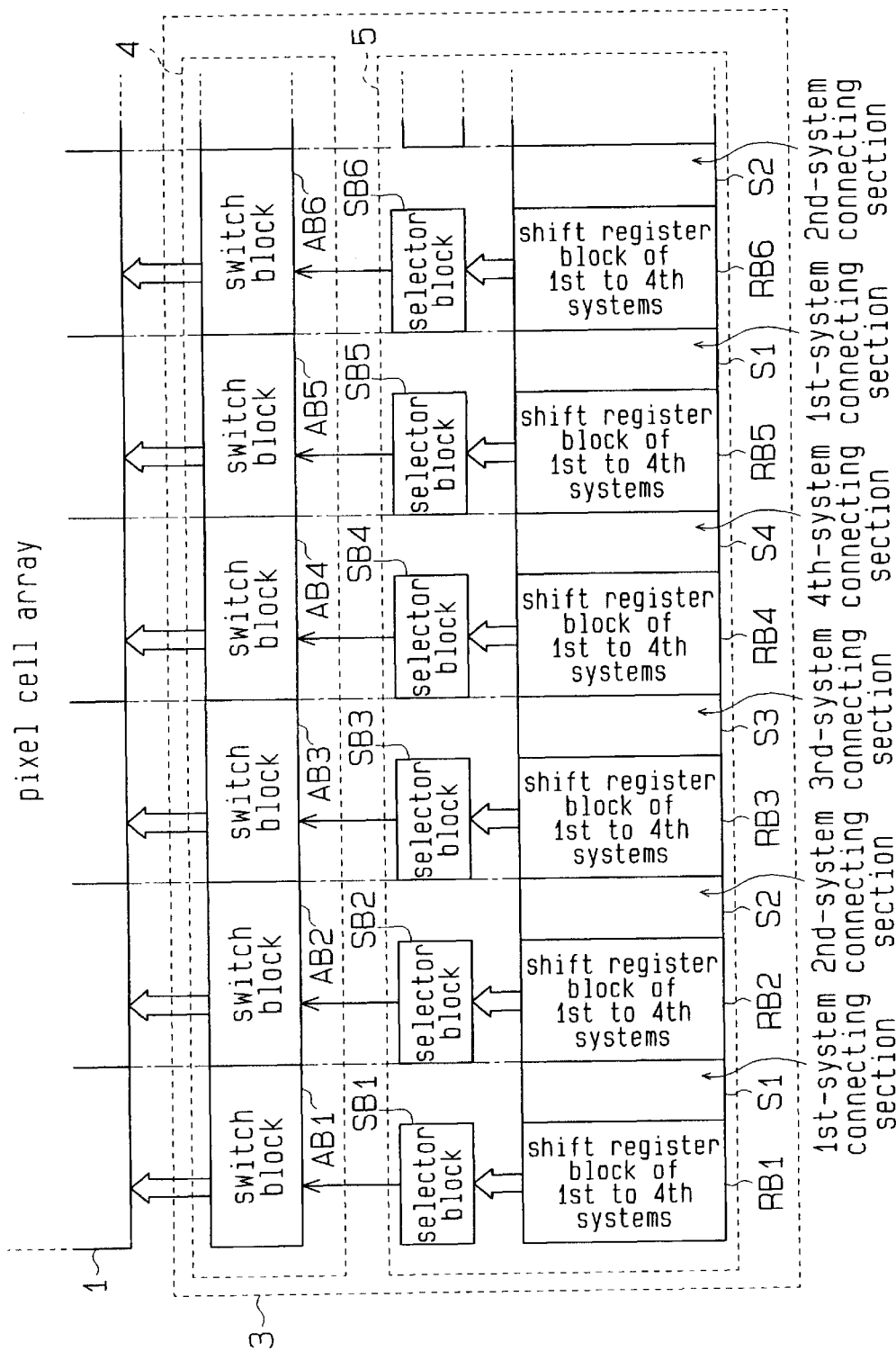

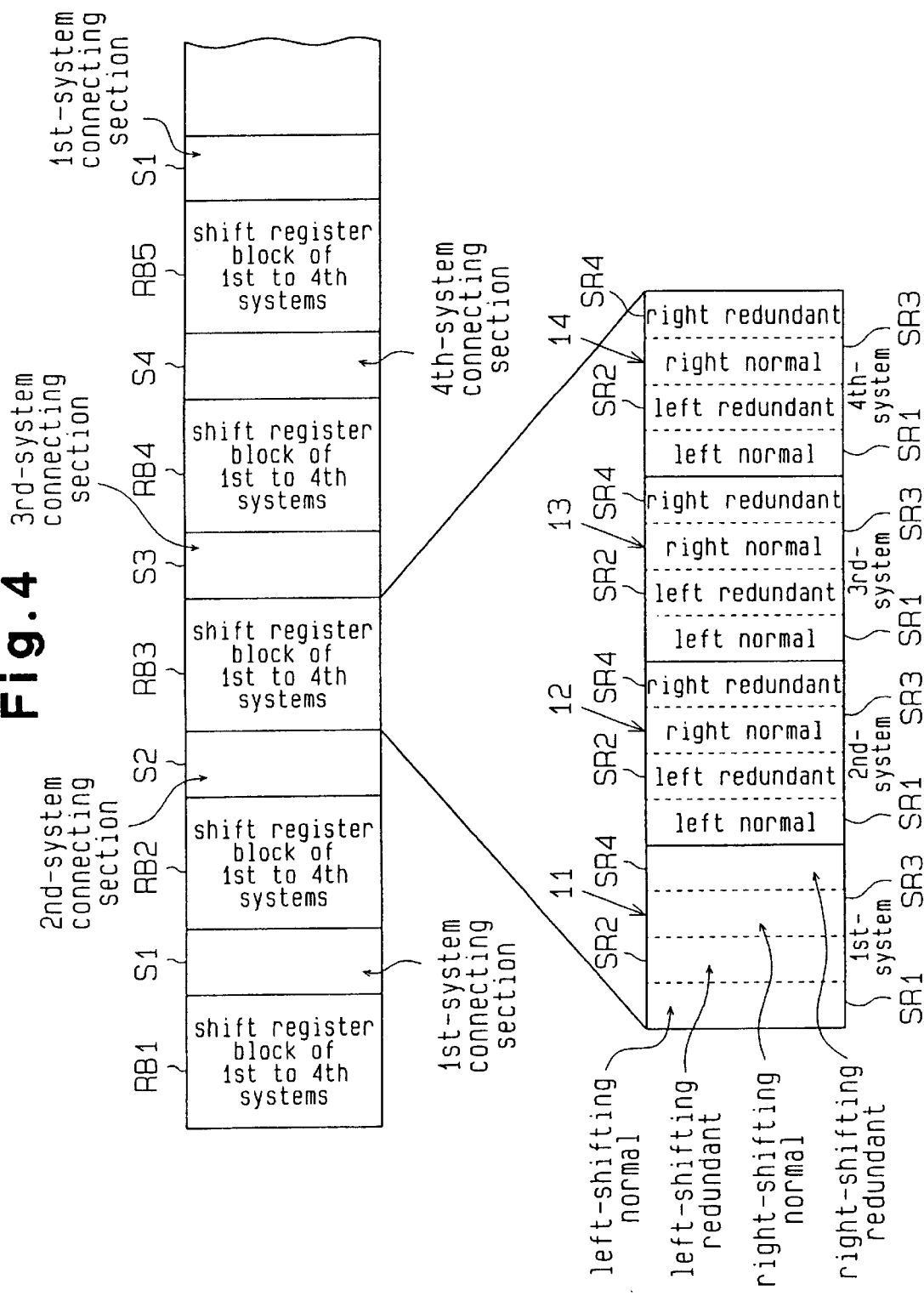

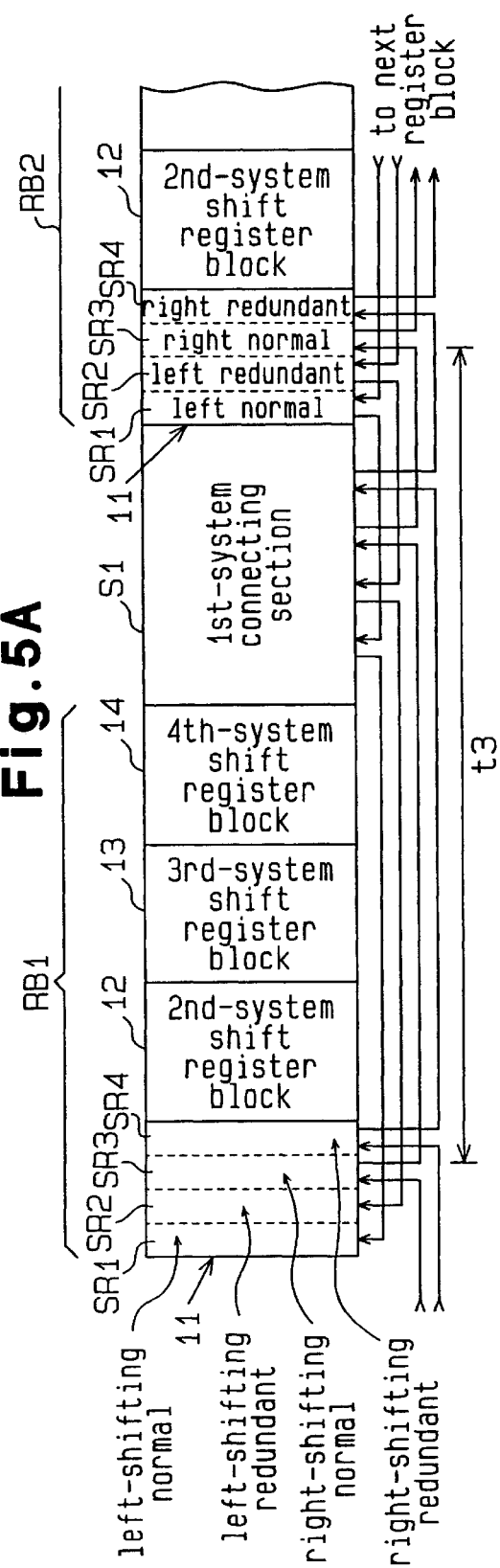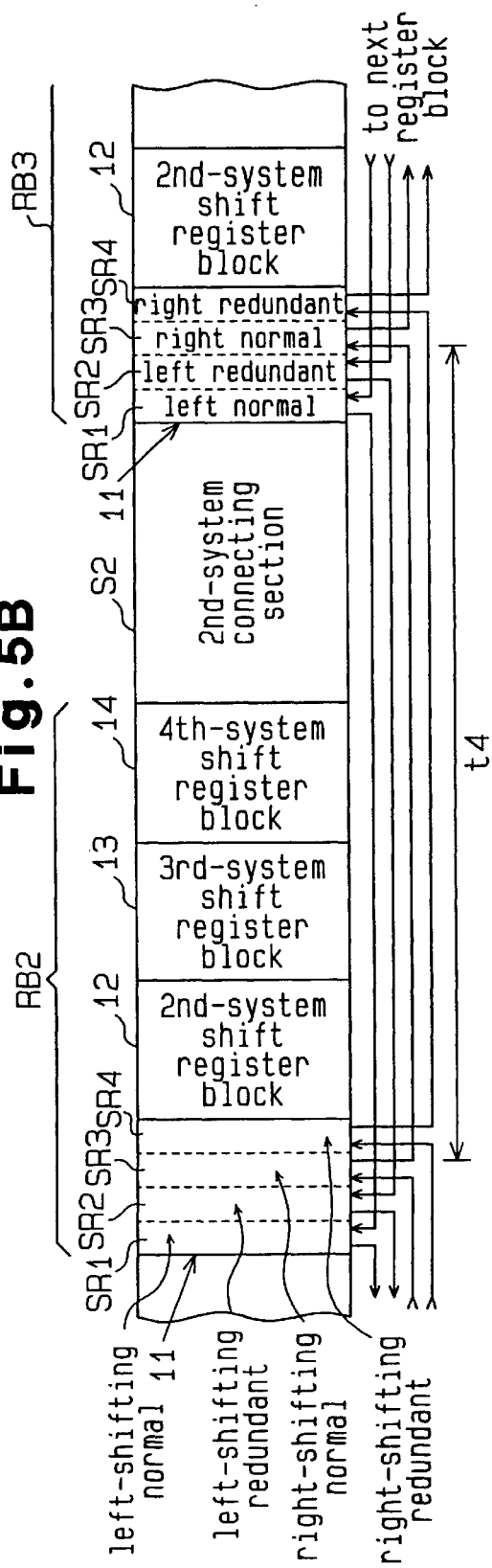

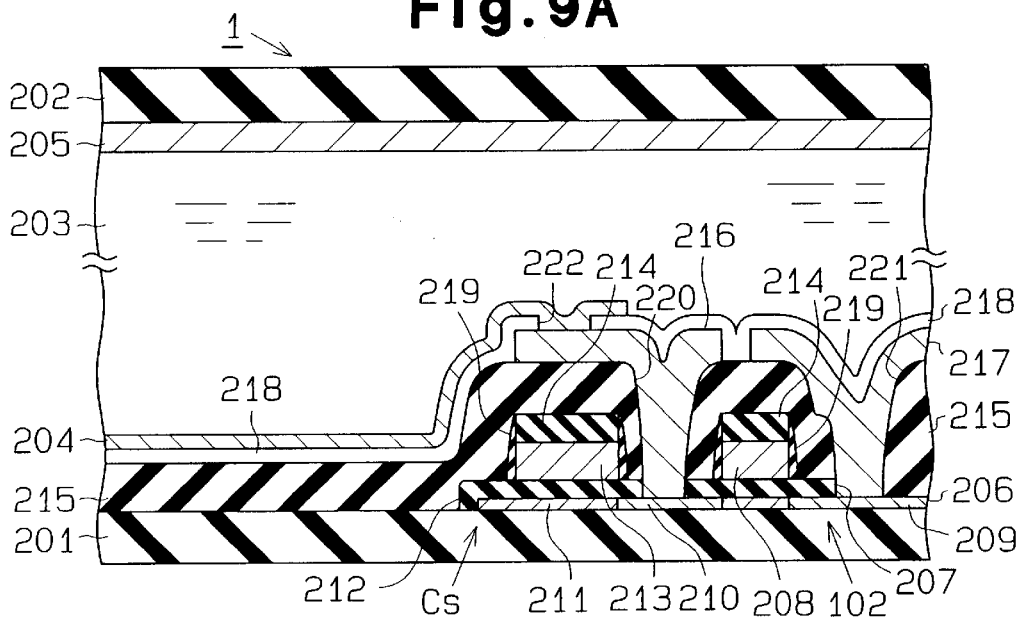
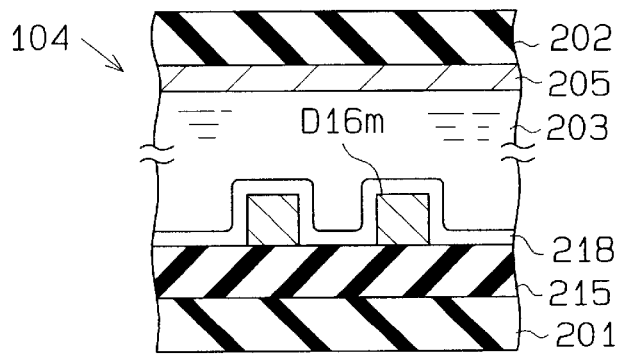
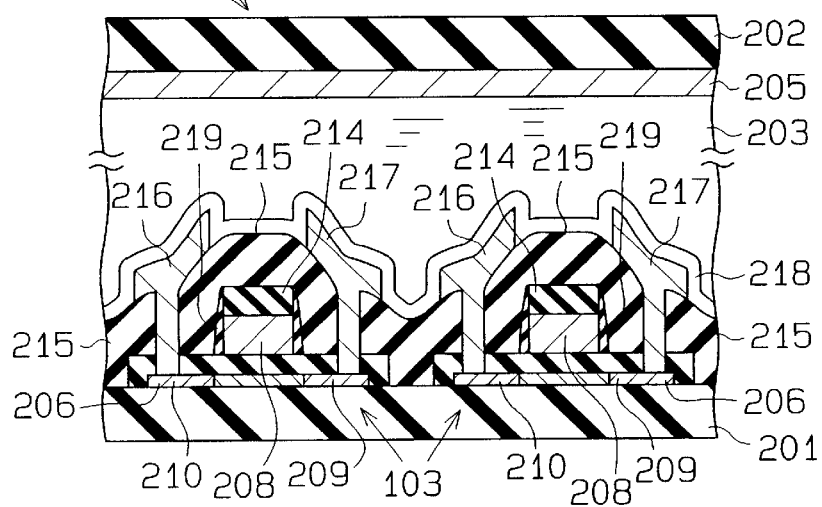

SHIFT REGISTER CIRCUIT AND DISPLAY UNIT INCORPORATING THE SAME

BACKGROUND OF THE INVENTION

1. Field of the Invention

The present invention relates generally to a shift register circuit and a display unit incorporating the same, and more particularly, to an active matrix addressing mode liquid crystal display unit, in which a driver and a pixel portion connected thereto are integrated. The driver has a shift register circuit including a plurality of signal shifting systems.

2. Description of the Related Art

Recently, active matrix addressing mode liquid crystal display (LCD) units employing thin film transistors (TFT's) are known to provide a high image quality display. Dot matrix LCD's employing dots arranged in the form of a matrix are classified into two types: simple matrix addressing mode and active matrix addressing mode.

In the simple matrix addressing mode, the liquid crystal in the pixels arranged in the matrix is directly driven in synchronization with scanning signals. A liquid crystal panel of the LCD is formed by the use of electrodes and a liquid crystal. Accordingly, when the number of scanning lines is increased, the duty cycle for each pixel is shortened. This brings about contrast reduction.

In the active matrix addressing mode, each pixel arranged in the matrix has an active element as a pixel driving element and a signal storage element (i.e., pixel capacitance). Both the driving element and the storage element are integrated in the pixel. Each pixel performs signal storing behavior, and the liquid crystal is driven semi-statically. In other words, the pixel driving element functions as a switch element that is controlled in response to scanning signals. When the pixel driving element is actuated, the associated pixel receives a data signal indicating display data via the pixel driving element to drive the liquid crystal. When the pixel driving element is then deactivated, the data signal applied to the pixel is stored in the form of electric charge in the associated signal storage element. Driving of the liquid crystal is continuously controlled based on the electric charge thus stored until the pixel driving element resumes an ON-state. Accordingly, in spite of the fact that the driving time for each pixel is reduced due to the increased number of the scanning lines, driving control of the liquid crystal is not affected, and there is no contrast reduction. Therefore, the active matrix addressing mode provides a very high image quality display compared with the simple matrix addressing mode.

The active matrix addressing mode is classified depending on the type of the pixel driving elements into two types; three-terminal transistor type and diode type. Although the transistor type matrix addressing mode involves difficulties in production compared with the diode type matrix driving mode, the transistor type has superior contrast and resolution properties as compared to the diode type. Further, the transistor type matrix addressing mode permits attainment of CRT image quality in LCD units.

FIG. 1 shows a data driver incorporated in a conventional active matrix addressing mode LCD unit. This data driver includes a shift register circuit 50, which has four signal shifting systems. The shift register circuit 50 includes a plurality of shift register blocks (hereinafter simply called "register blocks") 51 to 53 and a plurality of connection circuits 60 arranged in a line with the register blocks. The individual connection circuits 60 are arranged with a predetermined number of register blocks in between, and each connection circuit 60 includes four connecting sections 61 to 64, which belong to the first to fourth systems.

Each of the register blocks 51 to 53 has four groups of shift registers 54 to 57, which belong to the first to fourth systems and are arranged in the order from the first system to the fourth system. Each of the shift register groups 54 to 57 of the first to fourth systems has a normal shift register and a redundant shift register. More specifically, the shift register groups 54 to 57 are arranged in the order of the normal and redundant shift registers SSR1 and RSR1 of the first system, the normal and redundant shift registers of the second system, the normal and redundant shift registers of the third system and the normal and redundant shift registers of the fourth system.

The individual normal shift registers SSR1 belonging to the first system of the individual register blocks 51 to 53 are connected in series. The individual redundant shift registers RSR1 belonging to the first system of the register blocks 51 to 53 are also connected in series. The individual normal shift registers belonging to the second, third and fourth systems of the register blocks 51 to 53 are likewise connected in series system by system. The individual redundant shift registers belonging to the second, third and fourth systems of the register blocks 51–53 are likewise connected in series system by system.

The first connecting section 61 of the connection circuit 60, arranged between the register blocks 51 and 52, connects the first-system shift register group 54 (the normal and redundant shift registers SSR1 and RSR1) of the register block 51 to the first-system shift register group 54 (the normal and redundant shift registers SSR1 and RSR1) of the register block 52. The second connecting section 62 connects the second-system shift register group 55 of the register block 51 to the second-system shift register group 55 of the register block 52. The third connecting section 63 connects the third-system shift register group 56 of the register block 51 to the third-system shift register group 56 of the register block 52. The fourth connecting section 64 connects the fourth-system shift register group 57 of the register block 51 to the fourth-system shift register group 57 of the register block 52.

Each of the connecting sections 61 to 64 determines if the normal shift register belonging to each system is performing the normal shift operation, and when the normal shift register does not execute the normal shift operation, each connecting section switches the shift operation to that of the redundant shift register and sends a data signal to the normal and redundant shift registers in the subsequent stage and to a sampling transistor circuit (not shown). The sampling transistor circuit performs an ON/OFF action in response to the data signal from the shift register circuit and samples a video signal supplied from a video signal processor (not shown). The sampled video signal is applied to the individual pixel cells to display an image on the screen of the LCD unit.

The interconnection distance between the register blocks 51 and 52, with the connecting sections 61 to 64 of the individual systems, arranged in the above-described manner, is longer than the interconnection distance between the register blocks 52 and 53 that have no connecting sections. That is, the data transmission time t1 from the output point of a data signal from the register block 51 to the reception point of the data signal by the register block 52 is longer than the data transmission time t2 from the output point of a data signal from the register block 52 to the reception point of the data signal by the register block 53. Therefore, the propagation delay time of a data signal between the register blocks 51 and 52 between which the connection circuit 60 is provided is longer than the propagation delay time of a data signal between the register blocks 52 and 53 between which no connection circuit is provided. Consequently, the LCD unit as a whole locally has those portions at which the propagation delay time of a data signal is longer, i.e., the propagation delay time varies from one place to another. This results in delayed sampling of a video signal by the enabled sampling transistor circuit, thus making it difficult to accurately display an image on the screen of a display unit. As a result, an image is discontinuously displayed on the screen, which is undesirable for a user. As a solution to this shortcoming, a video signal processor, timing controller or the like, which is provided separate from the LCD unit, may be used to reduce the video-signal sampling delay. In this case, however, the circuit structure of the display unit becomes complicated and the circuit scale becomes undesirably large.

SUMMARY OF THE INVENTION

Accordingly, it is a primary objective of the present invention to provide a shift register circuit and a display unit which reduce a variation in the data signal propagation delay times between shift register blocks.

To achieve the foregoing and other objectives and in accordance with the purpose of the present invention, an improved shift register circuit having a plurality of signal shifting systems is provided. The shift register circuit includes a plurality of shift register blocks and a plurality of connecting sections belonging to a plurality of signal shifting systems. Each of the shift register blocks includes a plurality of shift register groups respectively belonging to the signal shifting systems. The individual connecting sections are provided to mutually connect the shift register groups belonging to the associated signal shifting system. The shift register blocks and the connecting sections are arranged in a line in the shift register circuit. The connecting sections are separated by at least two connecting section groups in that line arrangement with at least one of the shift register blocks located between the connecting section groups.

The individual connecting section groups may consist of one connecting section and one of the shift register blocks may be located between the one connecting section and an adjoining connecting section. The individual connecting section groups may consist of a pair of the connecting sections and at least two of the shift register blocks may be located between one of the connecting section groups and the adjoining connecting section group.

BRIEF DESCRIPTION OF THE DRAWINGS

The invention, together objects and advantages thereof, may best be understood by reference to the following description of the presently preferred embodiments together with the accompanying drawings in which:

FIG. 2 is a block diagram illustrating an active matrix addressing mode liquid crystal display unit;

FIG. 3 is a block diagram illustrating shift register circuits according to the preferred embodiment;

FIG. 4 is a diagram illustrating register blocks;

FIGS. 5A and 5B are diagrams illustrating the connecting relationship of the shift register in the first system.

FIGS. 9A, 9B and 9C are schematic cross sectional views illustrating an LCD unit;

DETAILED DESCRIPTION OF THE PREFERRED EMBODIMENTS

Figure 1:
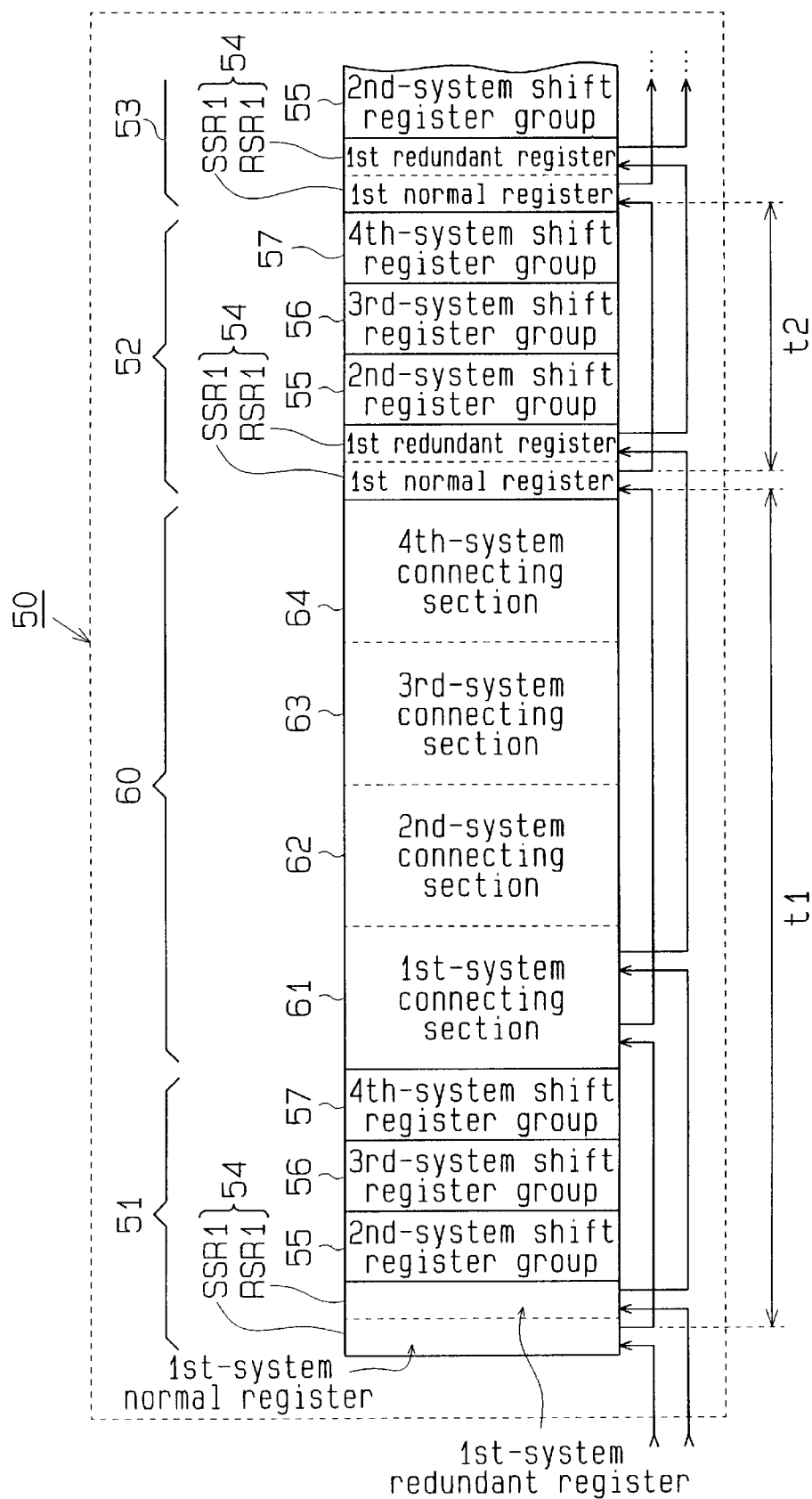
FIG. 1 is a block diagram illustrating conventional shift register circuits.

An LCD unit according to an embodiment of the present invention now will be described referring to FIGS. 2 to 10. FIG. 2 is a block diagram illustrating an active matrix addressing mode liquid crystal display (LCD) unit according to the present invention. An LCD unit 100 has a pixel cell array 1 as a pixel portion, a gate driver 2, a data driver 3 and a shift direction setting circuit 6. The gate driver 2 and the data driver 3 constitute a peripheral driving circuit 101. This embodiment is adapted to an integrated driver type (or built-in driver type) LCD unit in which the drivers 2 and 3 are formed on the same substrate for the pixel cell array.

The pixel cell array 1 has a plurality of scanning lines (i.e. gate wirings) $G_1 \ldots G_1$ connected to the gate driver 2, and has a plurality of data lines (i.e., drain wirings) $D_1 \ldots D_{16m}$ connected to the data driver 3. Each of the data lines intersects orthogonally with each of scanning lines $G_1 \ldots G_n$. The numbers n and m are integers. The pixel cell array 1 further has a plurality of pixel cells GC located on the intersections of each of the scanning lines $G_n$ and each of the data lines $D_{16m}$. A scanning signal (or gate signal) is applied to each of the scanning lines $G_1 \ldots G_n$. A video signal is applied to each of the data lines $D_1 \ldots D_{16m}$. In the integrated driver type LCD unit, the length of each of lines $G_1 \ldots G_n$ and $D_1 \ldots D_{16m}$ can be shortened to reduce the resistance and capacitance of the wirings. This brings about an improvement of the image quality.

The pixel cell GC has a TFT 102 as a pixel driving element, a liquid crystal cell LC and a storage capacitance CS (this is also called an auxiliary capacitance, an accumulation capacitance or an additional capacitance.). The TFT 102 has a gate connected to the scanning line $G_1$, a drain connected to the data line $D_1$ and a source connected to a display electrode (or a pixel electrode) LCE1 of the liquid crystal cell LC and to a first electrode CSE1 of the storage capacitance CS. The liquid crystal cell LC and the storage capacitance CS constitute a signal storage element. A voltage $V_{com}$ is applied to a common electrode LCE2 of the liquid crystal cells LC. A constant voltage $V_R$ is applied to a second electrode CSE2 of the storage capacitance CS. The common electrode LCE2 of the liquid crystal cell LC is an electrode shared by all of the pixel cells GC. A capacitance is established between a display electrode LCE1 and the common electrode LCE2 of the liquid crystal cell LC. The second electrode CSE2 of the storage capacitance Cs may be connected to the adjacent scanning line.

When a positive voltage is applied to the gate of the TFT 102 by applying a positive voltage to the scanning line $G_1$, the TFT 102 is allowed to assume an ON-state. Thus, the liquid crystal cell LC and the storage capacitance CS become charged based on the video signal applied to the data line $D_1$. On the contrary, when a negative voltage is applied to the gate of the TFT 102 by the negative voltage applied to the scanning line $G_1$, the TFT 102 is allowed to assume an OFF-state. The voltage applied to the data line $D_1$ at that time is held by the liquid crystal cell LC and the storage capacitance CS. Thus, the supply of the video signals to be written in the pixel cells GC via the data line $D_1$ and the voltage control with respect to the scanning line $G_1$ enable the pixels cell GC to hold the desired video signals. The transmittance of the liquid crystal cells LC changes depending on the video signals held by the pixel cells GC, and thus an image is produced on the display.

The Writing property and the holding property are important for the pixel cells GC. The writing property means the ability of the liquid crystal cell LC and the storage capacitance CS to write an arbitrary video signal voltage within a predetermined unit of time in accordance with the specifications of the pixel cell array 1. In the writing property, the video signal voltages should be written fully within the unit time. The holding property means the time that the liquid crystal cell LC and the storage capacitance CS can hold the thus written video signal voltages. In the holding property, the video signal voltages should be held for a necessary time. The storage capacitance CS promotes improvement of the holding property. The reason is that the storage capacitance CS compensates for the insufficiency in the capacitance of the liquid crystal cell LC, which cannot be increased greatly. In other words, the storage capacitance CS permits formation of a signal storage element having an increased capacitance.

The data driver 3 has a sampling transistor circuit 4 and a shift register circuit 5 which controls the operation of the sampling transistor circuit 4. The shift register circuit 5 receives a clock signals CK and /CK, and the data signal provided by an external timing controller 106. The shift register circuit 5 then performs a shift operation of the data signal in accordance with the clock signals CK and /CK. The shift register circuit 5 further controls the sampling transistor circuit 4 in order that the video signal provided by an external video signal processing circuit 103 via a video line VL can be applied to each of the data lines $D_1 \ldots D_{16m}$. A shift direction setting circuit 6 sets the direction of the shifting to the left or right in accordance with the specifications of the LCD, then outputs a shift direction signal DR, which indicates the set direction, to the shift register circuit 5.

As shown in FIG. 3, a shift register circuit 5 having first to fourth signal shifting systems includes a plurality of shift register blocks (hereinafter called "register blocks") RB1, RB2, ..., and RBm, connecting sections S1 to S4 belonging to the first to fourth signal shifting systems, and a plurality of selector blocks SB1, SB2, ..., and SBm associated with the register blocks. A sampling transistor circuit 4 has a plurality of analog switch blocks (hereinafter called "switch blocks") AB1, AB2, ..., and ABm which are connected to the respective selector blocks SB1, SB2, ..., and SBm. This invention may be adapted to a shift register circuit 5 which has two, three, five or more signal shifting systems.

As shown in FIG. 4, each of the register blocks RB1, RB2, ..., and RBm has four shift register groups 11 to 14 which belong to the first to fourth systems, respectively. Each of the shift register groups 11 to 14 performs a shift operation in the order from the first system to the fourth system. The number of shift register groups may be changed in accordance with the number of the systems. Each of the shift register groups 11 to 14 includes a left-shifting normal shift register (hereinafter called "left normal register") SR1, a leftshifting redundant shift register (hereinafter called "left redundant register") SR2, a right-shifting normal shift register (hereinafter called "right normal register") SR3, and a right-shifting redundant shift register (hereinafter called "right redundant register") SR4. However, this invention may be adapted to a shift register circuit which has only a left normal register and a left redundant register, or a shift register circuit which has only a right normal register and a right redundant register. Further, a plurality of redundant registers may be provided with respect to each normal register.

The individual left normal registers SR1 belonging to the first system of the individual register blocks RB1, RB2, ..., and RBm are connected in series. The individual left redundant registers SR2 belonging to the first system of the register blocks RB1, RB2, ..., and RBm are also connected in series. The individual right normal registers SR3 belonging to the first system are connected in series. The individual right redundant registers SR4 belonging to the first system are also connected in series. The individual left normal shift registers SR1, left redundant registers SR2, right normal registers SR3 and right redundant registers SR4 belonging to each of the second, third and fourth systems of the register blocks RB1, RB2, ..., and RBm are likewise connected in series system by system.

The LCD unit of this embodiment is used as a liquid crystal (LC) panel for an LC projection system, for example. To display an image on the screen, the LC projection system uses three LCD units as R, G and B light values and combines lights having passed the LCD units by a plurality of dichroic mirrors and mirrors. This system requires that a normal image and a mirror-inverted image be selectively displayed on the screens of the individual LCD units in accordance with the number of times the light is reflected by the dichroic mirrors or the mirrors. To selectively display a normal image and a mirror-inverted image, each LCD unit has the left normal register SR1 and the left redundant register SR2 for performing a shift operation leftward from the rightward direction as viewed from the front of the screen, and the right normal register SR3 and the right redundant register SR4 for performing a shift operation rightward from the leftward direction as viewed from the front of the screen. This structure ensures the display of a normal image by sampling a video signal in the leftward direction from the rightward direction and the display of a mirror-inverted image by sampling a video signal in the rightward direction from the leftward direction, and is effective as LCD units for R, G and B colors.

As shown in FIG. 3, the multiple register blocks RB1, RB2, ..., and RBm and the multiple connecting sections S1 to S4 are arranged in a line in the shift register circuit 5 so that a single register block is located between every two adjoining connecting sections. The connecting sections S1 to S4 are arranged in the order from the connecting section S1 belonging to the first system to the connecting section S4 belonging to the fourth system after which the connecting section S1 comes and so forth. In other words, the connecting section S1 belonging to the first system is located between the register blocks RB1 and RB2, the connecting section S2 belonging to the second system is located between the register blocks RB2 and RB3, the connecting section S3 belonging to the third system is located between the register blocks RB3 and RB4, the connecting section S4 belonging to the fourth system is located between the register blocks RB4 and RB5, the connecting section S1 belonging to the first system is located between the register blocks RB5 and RB6, and so forth. Therefore, the interconnection distances between the individual register blocks RB1–RBm are equal to one another.

Each pair of shift register groups 11 to 14 are connected together via the associated one of the connecting sections S1 to S4. As shown in FIG. 5A, for example, the left normal register SR1 in the shift register group 11 belonging to the first system in the register block RB1 is connected to the left normal register SR1 and the left redundant register SR2 in the shift register group 11 belonging to the first system in the register block RB2 via the connecting section S1 belonging to the first system. Likewise, the left redundant register SR2 in the register block RB1 is connected to the left redundant register SR2 and the left normal register SR1 in the register block RB2 via the connecting section S1 belonging to the first system. Further, the right normal register SR3 in the register block RB1 is connected to the right normal register SR3 and the right redundant register SR4 in the register block RB2 via the connecting section S1. The right redundant register SR4 in the register block RB1 is connected to the right redundant register SR4 and the right normal register SR3 in the next register block RB3 via the connecting section S1.

FIG. 5B shows the connecting relationship for the first system. The connecting section S2 belonging to the second system is located between the register blocks RB2 and RB3. The left normal register SR1 in the shift register group 11 belonging to the first system in the register block RB2 is connected to the left normal register SR1 in the shift register group 11 belonging to the first system in the register block RB3. Likewise, the left redundant register SR2 in the register block RB2 is connected to the left redundant register SR2 in the register block RB3. The right normal register SR3 in the register block RB2 is connected to the right normal register SR3 in the register block RB3. Likewise, the right redundant register SR4 in the register block RB2 is connected to the right redundant register SR4 in the register block RB3. The shift register groups 12 to 14 belonging to the second to fourth systems have the same connecting relationship as that of the first system, though not illustrated.

The data signal propagation delay time for the first system between the register blocks RB1 and RB2 becomes slightly longer than those for the second to fourth systems because the propagation is achieved via the first-system connecting section S1. The second-system connecting section S2 to the fourth-system connecting section S4 are not arranged between the register blocks RB1 and RB2, however, the data signal propagation delay time for the first system is shorter than that of the prior art. Likewise, because the first-system connecting section S1, the third-system connecting section S3 and the fourth-system connecting section S4 are not arranged between the register blocks RB2 and RB3, the data signal propagation delay time for the second system through the second-system connecting section S2 is shorter than that of the prior art. Likewise, the data signal propagation delay time for the third system between the register blocks RB3 and RB4 and the data signal propagation delay time for the fourth system between the register blocks RB4 and RB5 are shorter than those of the prior art because the connecting sections of the other systems are not provided. This reduces a variation in the data signal propagation delay times between the individual register blocks RB1 to RBm. Further, the propagation delay times for the second to fourth systems between the register blocks RB1 and RB2, which do not involve the first-system connecting section S1, are shorter than those of the prior art, thus contributing to the reduction of a variation in the data propagation delay time.

As the connecting sections S1 to S4 of the individual systems are dispersed, the interconnection distances between the individual register blocks become approximately even. More specifically, the data transfer time t3 from the point of outputting a data signal from the register block RB1 to the reception of the data signal by the register block RB2 is approximately equal to the data transfer time t4 from the point of outputting a data signal from the register block RB2 to the reception of the data signal by the register block RB3. Therefore, there is hardly a delay in sampling a video signal so that an image can be accurately displayed on the screen of the display unit. It is thus possible to continuously display images within the screen and present high-quality images to users.

Figure 6:
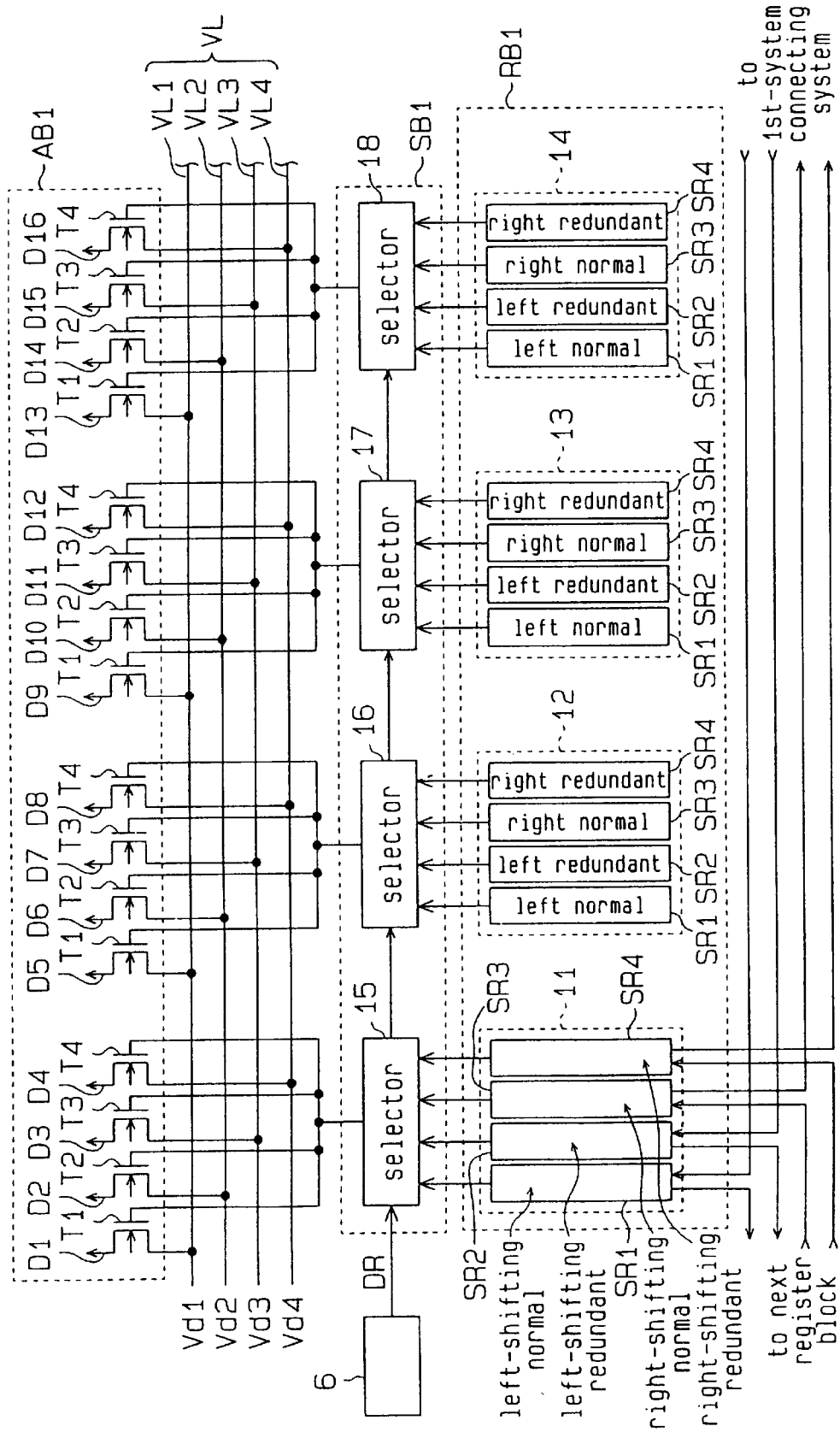
FIG. 6 is a block diagram illustrating switch blocks, selector blocks and shift register blocks.

As shown in FIG. 6, the selector block SB1 has four selectors 15 to 18 corresponding to the shift register groups 11 to 14 belonging to the first to fourth systems. Each of the selectors 15 to 18 is connected to the left and right normal registers and left and right redundant registers SR1 to SR4 and one of the connecting sections S1 to S4 associated with the same system. Each of the selectors 15 to 18 selects one of shift data signals from the left and right normal and redundant registers SR1 to SR4 in accordance with a shift direction signal DR from a shift direction setting circuit 6 and a control signal from the associated one of the connecting sections S1 to S4 of the associated system, and supplies the selected shift data signal to the switch block AB1.

The switch block AB1 has four transistor groups corresponding to the selectors 15–18, and each transistor group consists of four N channel MOS transistors (hereinafter simply called "NMOS transistors") T1 to T4 as analog switches. Each of the NMOS transistors T1 to T4 has a gate connected to the output terminal of the associated one of the selectors 15–18 of the associated system, and a drain connected to a pixel cell GC. The NMOS transistor T1 has a source connected to a video line VL1, and the NMOS transistor T2 has a source connected to a video line VL2. The NMOS transistor T3 has a source connected to a video line VL3, and the NMOS transistor T4 has a source connected to a video line VL4.

Video signals Vd1 to Vd4, the images of which are to be displayed, shift from one another by one pixel, and are supplied to the respective video lines VL1 to VL4 from an external video signal processor 103. The four NMOS transistors T1 to T4 simultaneously perform an ON/OFF action in response to the shift data signal output from the associated one of the selectors 15–18 belonging to the associated system.

When right shift is set, for instance, the signal from right normal register SR3 or the right redundant register SR4 is selected. Further, the associated connecting section determines whether or not the right normal register SR3 is performing the normal or proper shifting operation and sends a control signal including the determination result to the associated one of the selectors 15 to 18.

Figure 7:
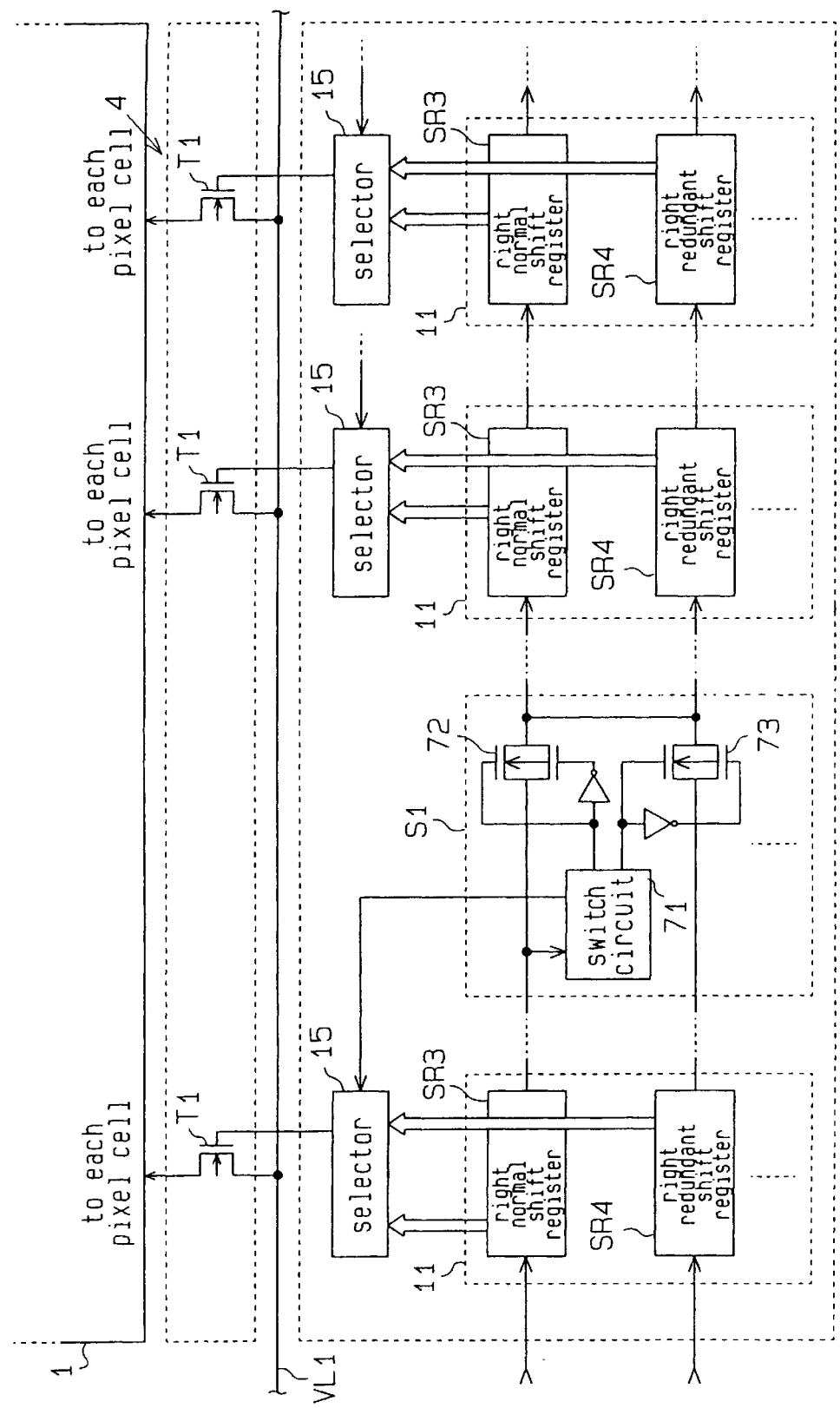
FIG. 7 is a block diagram illustrating shift registers and the connecting section, each belonging to the first system.

FIG. 7 is a block diagram showing the right normal register SR3 and the right redundant register SR4 of a plurality of shift register groups 11 and a part of the connecting section S1, which belong to the first system. Since the shift register groups 12 to 14 and the connecting sections S2 to S4, respectively, belonging to the second to fourth systems function in the same manner as those of the first system, their illustration is omitted.

The connecting section S1 has a switch circuit 71 and two transmission gates 72 and 73. The connecting section S1 further has a switch circuit and two transmission gates associated with the left normal register SR1 and left redundant register SR2, though not illustrated. The switch circuit 71 receives a data signal from the right normal register SR3 and determines if the register SR3 is performing the normal shifting operation based on that data signal.

When the right normal register SR3 is executing the normal shifting operation, the switch circuit 71 controls the transmission gates 72 and 73 so that the gate 72 is turned on while the gate 73 is turned off. Consequently, the data signal from the right normal register SR3 is supplied via the transmission gate 72 to the right normal register SR3 and right redundant register SR4 of the shift register group 11 of the next stage. Further, the switch circuit 71 sends to the selector 15 the control signal which instructs the supply of the shift data signal from the right normal register SR3 to the individual NMOS transistors T1 to T4 (only T1 shown). The individual NMOS transistors perform the ON/OFF actions in response to the shift data signal from the right normal register SR3 and apply video signals, which are to be transferred to the video lines VL1 to VL4 (only VL1 shown), to the individual pixel cells in a pixel cell array 1 via data lines D1 to D4.

When the right normal register SR3 is not performing the normal shifting operation, on the other hand, the switch circuit 71 controls the transmission gates 72 and 73 so that the gate 72 is turned off while the gate 73 is turned on. As a result, the data signal from the right redundant register SR4 is supplied via the transmission gate 73 to the right normal register SR3 and right redundant register SR4 of the shift register group 11 of the next stage. Further, the switch circuit 71 sends to the selector 15 the control signal which instructs the supply of the shift data signal from the right redundant register SR4 to the individual NMOS transistors T1 to T4. The individual NMOS transistors perform the ON/OFF actions in response to the shift data signal from the right redundant register SR4. Therefore, video signals are continuously applied to the individual pixel cells without stopping the shifting of the data signal, thus allowing an image to be surely displayed on the screen.

When the shift direction signal DR indicating the leftward shifting is output from the shift direction setting circuit 6, as another example, the supply of the shift data signal from the left normal register SR1 or the left redundant register SR2 is selected. Each of the connecting sections S1 to S4 determines if the left normal registers SR1 and the left redundant registers SR2 are functioning properly and supplies a control signal including the determination result to the selector 15. When it is determined that the left normal register SR1 is performing the normal shifting operation, the data signal from the left normal register SR1 is selected. The signal from the left normal register SR1 is then supplied to the switch block AB1 and the left normal register SR1 and left redundant register SR2 of the register block of the next stage which belongs to the first system. When it is determined that the left normal register SR1 is not performing the normal shifting operation, the data signal from the left redundant register SR2 is selected. The signal from the left redundant register SR2 is then supplied to the switch block AB1 and the left normal register SR1 and left redundant register SR2 of the register block of the next stage which belongs to the first system.

As shown in FIG. 6, the second-system selector 16 selects one of the shift data signals and performs such control that the NMOS transistors T1 to T4 simultaneously execute the ON/OFF actions. Consequently, the video signals Vd1 to Vd4 are applied to the individual pixel cells GC via data lines D5 to D8. Further, the third-system selector 17 selects one shift data signal and performs such control that the NMOS transistors T1 to T4 simultaneously execute the ON/OFF actions. Accordingly, the video signals Vd1 to Vd4 are applied to the individual pixel cells GC via data lines D9 to D12. Likewise, the fourth-system selector 18 selects one shift data signal and performs such control that the NMOS transistors T1 to T4 simultaneously execute the ON/OFF actions. Consequently, the video signals Vd1 to Vd4 are applied to the individual pixel cells GC via data lines D13 to D16.

In this manner, one register block RB1 applies the video signals Vd1 to Vd4 to sixteen pixel cells GC via sixteen data lines D1 to D16. As shown in FIG. 3, therefore, the total width of the register block RB1 and the first-system connecting section S1 is designed to be the same as the total width of sixteen pixel cells GC to which the video signals Vd1 to Vd4 are applied by the register block RB1. Likewise, each of the total width of the register block RB2 and the second-system connecting section S2, the total width of the register block RB3 and the third-system connecting section S3 and the total width of the register block RB4 and the fourth-system connecting section S4 is designed to be the same as the total width of the associated sixteen pixel cells GC.

Figure 8:
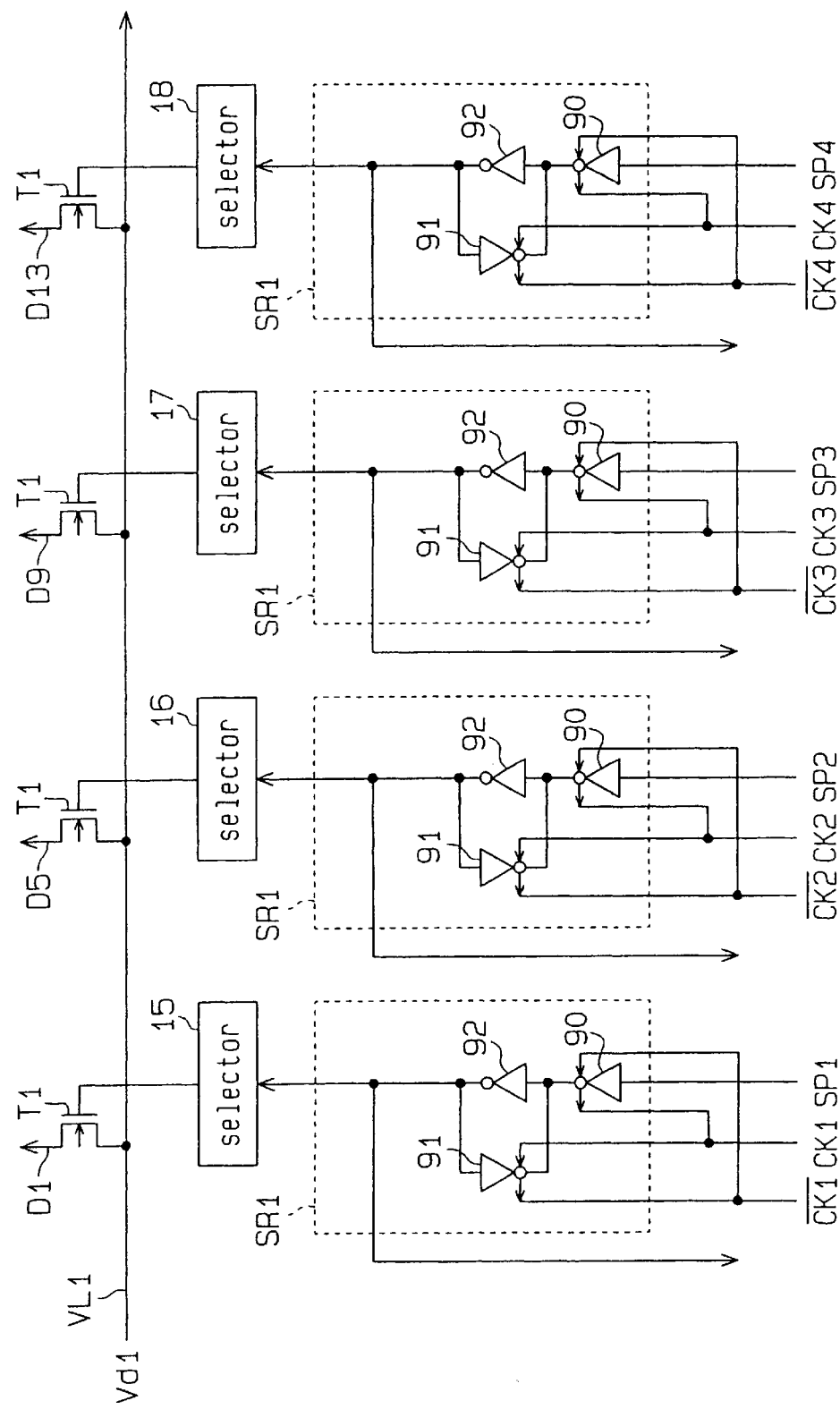
FIG. 8 is a diagram of circuits illustrating left-shifting normal shift registers belonging to the first to fourth systems.

FIG. 8 is a circuit diagram showing the left normal registers SR1 of the first to fourth systems. As the right normal registers and the left and right redundant registers SR2 to SR4 of the first to fourth systems have the same structures as that of the left normal register SR1, their illustration and descriptions will not be given. The left normal register SR1 has two clocked inverters 90 and 91 and inverter 92. Each of the clocked inverters 90 and 91 has a first input terminal to receive a data signal, a second input terminal to receive a clock signal CK and a third input terminal to receive a clock signal /CK. The clocked inverters 90 and 91 output inverted data signals in response to a low-level clock signal CK and a high-level clock signal /CK.

A timing controller generates clock signals CK1 and /CK1 to CK4 and /CK4, shifted in phase by a quarter period from one another, and supplies those clock signals to the left normal registers SRI of the first to fourth systems. The first-system left normal register SR1 shifts a data signal SP1 in response to the clock signals CK1 and /CK1. The second-system left normal register SR2 shifts a data signal SP2 in response to the clock signals CK2 and /CK2. The third-system left normal register SR3 shifts a data signal SP3 in response to the clock signals CK3 and /CK3. The fourth-system left normal register SR4 shifts a data signal SP4 in response to the clock signals CK4 and /CK4.

As the individual left normal registers SR1 to SR4 perform shift operations, the NMOS transistors T1 to T4 (only T1 shown) of the individual systems are sequentially turned on or off with a quarter-period shift therebetween. When the NMOS transistor is turned on, the video signal transferred to the associated one of the video lines VL1 to VL4 (only VL1 shown) is sampled and the sampled video signal is supplied to the associated pixel cells. The supply of the clock signals CK1 and /CK1 to CK4 and /CK4, the phases of which are shifted by a quarter period from one another, allows the frequencies of the clock signals to be a quarter of the sampling frequency for the video signals. This feature simplifies the circuit structure of the timing controller associated with the generation of clock signals.

The TFT 102 of the pixel cell GC shown in FIG. 2 may be a polycrystalline silicon TFT employing a polycrystalline silicon film as an active layer formed on the transparent insulation substrate. A polycrystalline silicon TFT has the advantages of high mobility and high driving capability compared with a thin film transistor (hereinafter called "amorphous silicon TFT") employing an amorphous silicon film as the active layer. The polycrystalline may be employed not only as a pixel driving element but also as an element in a logic circuit. Therefore, use of this polycrystalline silicon TFT to form the peripheral driving circuit 101 including the pixel cell array 1, the gate driver 2 and the data driver 3 enables fabrication of an integrated driver type LCD unit. In the integrated driver type LCD unit, the polycrystalline silicon TFT as a pixel driving element located on the pixel cell array is formed in the same step as the polycrystalline silicon TFT contained in the drivers 2 and 3. The high mobility polycrystalline silicon TFT enables a higher-performance of the drivers 2 and 3 and improves the image quality. Amorphous silicon TFT may be used in place of the polycrystalline silicon TFT.

FIG. 9A is a schematic cross-sectional view illustrating the pixel cell array 1 of a transparent integrated driver type LCD unit employing a planar polycrystalline silicon TFT. FIG. 9B is a schematic cross-sectional view illustrating the wiring portion 104 (see FIG. 2) between the pixel cell array 1, and the drivers 2 and 3. FIG. 9C is a schematic cross-sectional view illustrating the drivers 2 and 3.

As shown in FIG. 9A, the pixel cell array 1 has a pair of transparent insulating substrates 201 and 202 located to oppose each other. A TFT 102 and storage capacitance CS are located on the transparent insulating substrate 201. A common electrode 205 is located on the transparent insulating substrate 202. Further, the pixel cell array 1 has a liquid crystal layer 203 consisting of a liquid crystal filled between the substrates 201 and 202. The TFT 102 has a polycrystalline silicon film 206, as the active layer, formed on the transparent insulating substrate 201. A drain area 209 and a source area 210 are defined in the polycrystalline silicon film 206 at a predetermined interval. A gate insulation film 207 is formed on the polycrystalline silicon film 206. A gate electrode 208 is formed as the scanning line on the gate insulation film 207. The drain area 209, source area 210, the gate insulation film 207 and the gate electrode 208 constitute the TFT 161.

The storage capacitance CS is located near the TFT 102. The storage capacitance CS is formed in the same step as the TFT 102 is formed. The storage capacitance CS has a storage electrode 211 defined in the polycrystalline silicon film 206. This storage electrode 211 is connected to the source area 210 of the TFT 102. A dielectric film 212 is layered on the storage electrode 211. The dielectric film 212 is of the same material as the gate insulation film 207 and is formed in the same step as the gate insulation film 207. A counter electrode 213 is used as the second electrode CSE2 of the storage capacitance CS on the dielectric film 212. The counter electrode 213 is of the same material as the gate electrode 208 and is formed in the same step as the gate insulation film 208. Insulation films 219 are layered on the counter electrode 213 and the gate electrode 208, respectively. Further, insulation films 214 are layered on the counter electrode 213 and the gate electrode 208, respectively.

An interlayer insulation film 215 is formed on the transparent insulating substrate 201 to shield the TFT 161 and the storage capacitance CS. The interlayer insulation film 215 contains contact holes 220 and 221 which communicate to the source area 210 and the drain area 215. A source electrode 216, which is formed in the contact hole 220 and on a portion of interlayer insulation film 215, is electrically connected to the source area 210. A drain electrode 117 as a data line is formed in the contact hole 221 and on a portion of the interlayer insulation film 216 and is electrically connected to the drain area 209. The source electrode 216 and the drain electrode 217 are spaced from each other. As the material of the source electrode 216 and the drain electrode 217, an aluminum alloy is generally used.

An insulation film 218 is formed over the entire surface of the substrate including the drain electrode 217, source electrode 216 and interlayer insulation film 215. This insulation film 218 contains a contact hole 222 communicating with the source electrode 216. A display electrode 204, which is formed on the insulation film 218 and in the contact hole 222, is electrically connected to the source electrode 216. The display electrode 204 opposes the common electrode 205. As the material of the display electrode 204, ITO (indium tin oxide) is generally used.

The source area 210 is connected to the display electrode 104 via the source electrode 216. This permits the source area 210 and the display electrode 204 to assume ohmic contact with each other. If the source electrode 216 is omitted, the source area 210 defined in the polycrystalline silicon film 206 and the ITO display electrode 204 are directly connected. This produces a heterojunction between the source area 210 and the display electrode 204. This heterojunction brings about band gap-oriented energy gap, resulting in the failure of excellent ohmic contact. This makes it difficult to correctly write data signals applied to the data line in pixel cells GC and lowers the image quality of the LCD unit.

As shown in FIG. 9B, wiring portion 104 has the scanning line $G_n$ and the data line $D_n$ located on the interlayer insulation film 215 (only data line $16_m$ is shown in FIG. 9B). As shown in FIG. 9C, the peripheral driving circuit 101, which includes the drivers 2 and 3, has a plurality of planar polycrystalline silicon TFT's 103 formed on a transparent insulating substrate 201. These TFT's 103 may be employed as a switching element of the peripheral driving circuit 101. The polycrystalline silicon TFT 103 is formed in the same step as the formation of the polycrystalline silicon TFT 102. In the polycrystalline silicon TFT 103, each member is given the same reference number as each corresponding member in the polycrystalline silicon TFT 102. The description of each of the members in the polycrystalline silicon TFT 103 is omitted. The insulation film 218 is formed over the entire surface of the substrate 201, on which the wiring portion 104 including the wirings $G_n$ and $D_n$ and the peripheral driving circuit 101 including each of TFT's 103 are formed. As in the case of the pixel cell array 1, the liquid crystal layer 203, the common electrode 205 and the transparent insulating substrate 202 are located on the insulation film 218. The peripheral driving circuit 101 may be formed outside the liquid crystal layer 203. In other words, the present invention may be adapted to a peripheral driving circuit having no liquid crystal layers.

The polycrystalline silicon film 206 can be formed according to the following methods:

(1) CVD method and PVD (Physical Vapor Deposition) method

In these methods, the polycrystalline silicon film 206 is directly formed. The CVD method includes atmospheric pressure CVD, low pressure CVD, plasma CVD and photo excited CVD. The PVD method includes vapor deposition, EB (Electron Beam) vapor deposition, MBE (Molecular Beam Epitaxy) and sputtering. Of these methods, the low pressure CVD method resorting to pyrolysis of a monosilane ($SiH_4$) or a disilane ($Si_2H_6$) is generally employed. This method enables formation of a polycrystalline silicon film 206 of very high quality. In the low pressure CVD method, a treatment temperature of about 550° C. or below gives an amorphous silicon film, while a treatment temperature of about 620° C. or above gives a polycrystalline silicon film. The plasma CVD method resorting to pyrolysis of a monosilane or disilane in plasma may be employed. The plasma CVD treatment is carried out at a temperature of about 300° C., and the reaction is accelerated by addition of hydrogen to form an amorphous silicon film. Addition of an inert gas (helium, neon, argon, krypton, xenon and radon) excites plasma to form a polycrystalline silicon film at any treatment temperature.

(2) Solid-phase growth method and zone melting recrystallization method

In these methods, the polycrystalline silicon film 206 is formed by forming an amorphous silicon film, followed by polycrystallization of the film. In the solid-phase growth method, the polycrystalline silicon film is formed by subjecting the amorphous silicon film to a heat treatment at about 600° C. for an extended time, e.g., about 20 hours, to effect polycrystallization of the solid film as such. In the zone melting recrystallization method, only the surface of the amorphous silicon film is fused, and the thus fused silicon film is recrystallized while the temperature of the substrate is maintained at 600° C. or below. The latter method includes laser annealing and RTA (Rapid Thermal Annealing). In the laser annealing method, the amorphous silicon film is irradiated with laser to heat-fuse the surface of the film. In the RTA method, the amorphous silicon film is irradiated with lamp light to heat-fuse the surface of the film.

The solid-phase growth method and zone melting recrystallization method (called low-temperature process) enable the formation of a polycrystalline silicon TFT at a low temperature, e.g., about 600° C. This permits use of normal glass (high-heat proof glass) as the transparent insulating substrate. The polycrystalline silicon TFT formed through the low temperature process is called a low temperature polycrystalline silicon TFT. In this embodiment, the low temperature polycrystalline silicon TFT is employed.

A conventional polycrystalline silicon TFT is formed at a high temperature, e.g., about 1000° C. This process is called a high-temperature process. The high-temperature process follows the LSI technology accumulated for many years. The polycrystalline silicon TFT formed through the high-temperature process (called a high-temperature polycrystalline silicon TFT) has excellent element property, reliability and repeatability. However, since the processing temperature is high in the high-temperature process, quartz glass has to be used as a transparent insulation substrate. The cost of large quartz glass is extremely high, and the size of quartz glass cannot be increased limitlessly. This limits the substrate size. Accordingly, an economically reasonable panel size of the LCD will be No. 2 or below. This panel size is suitable for video camera view finders and for liquid crystal projector LCD's, but it is too small to be used in direct-view LCD's.

On the other hand, the high-heat proof glass costs about 1/10 as much as the quartz glass and suffers no size limitation. Currently commercially available LCD high-heat resistance glass (e.g., No. 7059, Corning Inc., U.S.A.) has heat resistance of about 600° C. It is therefore possible to provide low-cost LCD's with a large panel by performing a low-temperature process of 600° C. or below throughout all the manufacturing process of the polycrystalline silicon TFT 102 and 103. The manufacturing process of the polycrystalline silicon TFT includes the forming of a polycrystalline silicon film 206, a gate insulation film 207, a source area 210 and a drain area 209.

Although only one embodiment of the present invention has been described herein, it should be apparent to those skilled in the art that the present invention may be embodied in many other specific forms without departing from the spirit or scope of the invention. Particularly, it should be understood that the invention may be embodied in the following forms.

Figure 10:
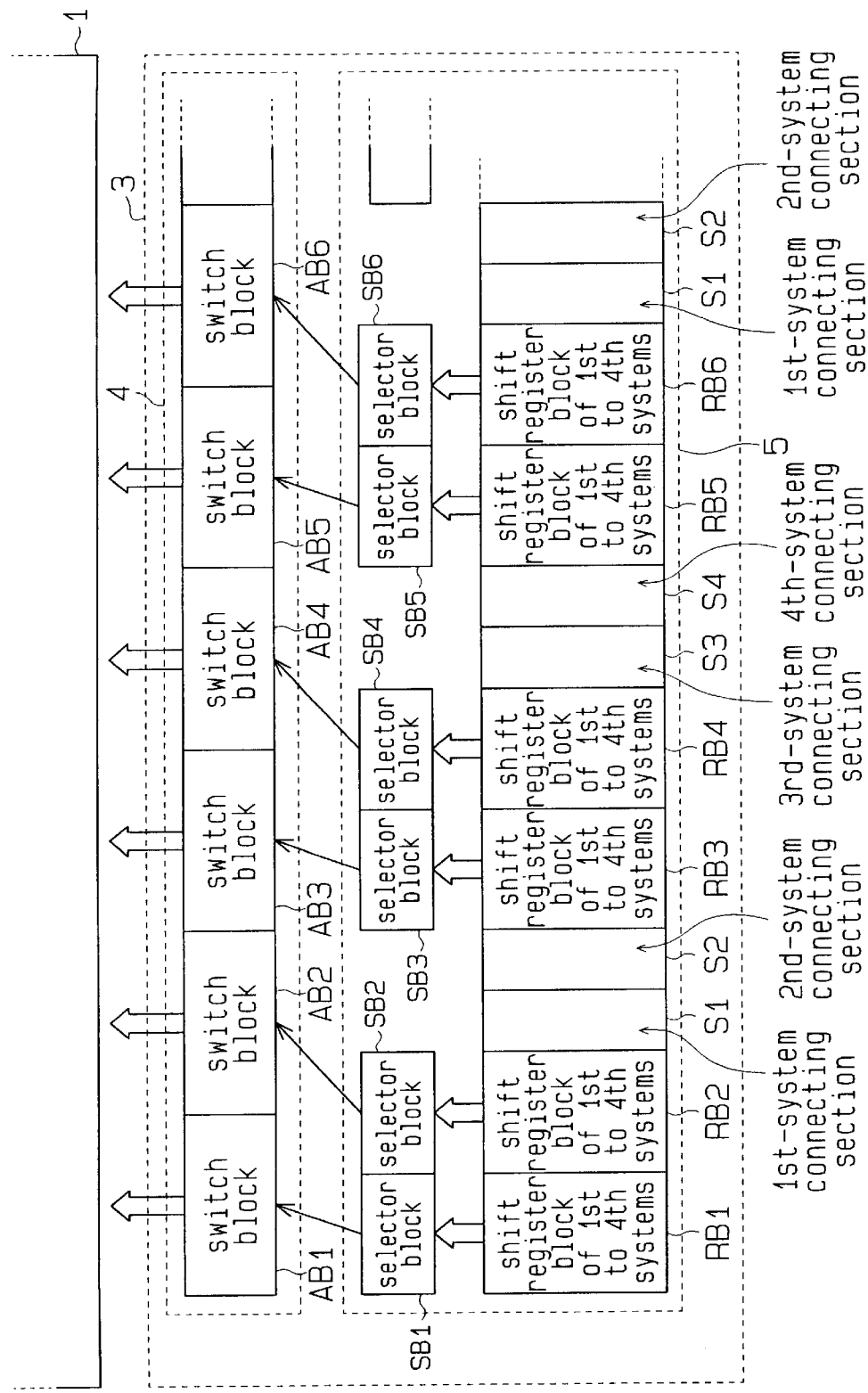
FIG. 10 is a block diagram illustrating a shift register circuit of another embodiment.

Instead of placing the first to fourth connecting sections S1 to S4 of the first to fourth systems one by one in numerical order between one register block and another register block, the first to fourth connecting sections S1 to S4 of the first to fourth systems may be placed one by one in numerical order between two or more register blocks and another two or more register blocks. Further, as shown in FIG. 10, the first to fourth connecting sections S1 to S4 of the first to fourth systems may be placed by two in numerical order between two or more register blocks and another two or more register blocks.

In the present invention, simple matrix addressing mode LCD may be employed instead of the active matrix addressing mode LCD.

Instead of adapting the present invention to the TFT-LCD unit, it can be applied to an MIM (Metal Insulator Metal)-LCD unit employing a diode to an STN (Super Twisted Nematic)-LCD unit.

The present invention may be adapted to an LCD unit on which the driver is mounted through TAB (Tape Automated Bonding) and COG (Chip On Glass).

In stead of a TFT of planar type, a TFT of reverse-planar type, stagger type and reverse-stagger type may be employed in the present invention.

The present invention may be adapted to a reflection type LCD unit instead of the of transparent type LCD unit.

Therefore, the present example and embodiments are to be considered as illustrative and not restrictive and the invention is not to be limited to the details given herein, but may be embodied within the scope of the appended claims.

What is claimed is:

1. A shift register circuit having a plurality of signal shifting systems, comprising:

a plurality of shift register blocks each including at least three shift register groups, wherein each shift register group respectively belongs to one of said signal shifting systems; and a plurality of connecting sections respectively belonging to said signal shifting systems, each of said plurality of connecting sections provided to mutually connect said shift register groups belonging to the associated signal shifting system, wherein adjacent pairs of shift register blocks are separated from other adjacent pairs of shift register blocks by at least two connecting sections and wherein an interconnect distance between connected shift register blocks is substantially equivalent so that data transfer times among the register blocks are substantially equivalent.

2. The shift register circuit according to claim 1, wherein each of said connecting sections comprises:

a first transmission gate, connected between a first shift register block and a second shift register block, for transmitting a first data signal from the first shift register block to the second shift register block;

a second transmission gate connected between the first shift register block and the second shift register block for transmitting a second data signal from the first shift register block to the second shift register block; and a switch circuit connected to the first shift register block and the first and second transmission gates for controlling the operation of the first and second transmission gates.

3. The shift register circuit according to claim 1, wherein there are four signal shifting systems, and said connecting sections belonging to a first through a fourth signal shifting systems are arranged as four separate connecting sections in said line arrangement, with one of said shift register blocks located between said four connecting sections.

4. The shift register circuit according to claim 1, wherein each of said shift register groups comprises a left-shift normal register, a left-shift redundant register, a right-shift normal register and a right-shift redundant register.

5. The shift register circuit according to claim 1, wherein there are four signal shifting systems; said connecting section, each respectively belonging to a first through a fourth signal shifting systems, are arranged as two separate connecting section groups in said line arrangement; and each of said connecting section groups comprising a pair of said connecting sections with two of said shift register blocks located between said one connecting section group and an adjoining connecting section group.

6. The shift register circuit according to claim 1, wherein each of said shift register groups includes a normal shift register and a redundant shift register that perform a same shifting operating;

each of said plurality of connecting sections includes means for determining if said normal shift register is executing a normal shifting operation based on a signal output from said normal shift register of first shift register groups belonging to a same signal shifting system; and when said normal shift register is performing a normal shifting operation, each of said connecting sections supplies said signal output from said normal shift register to said normal and redundant shift registers of second shift register group belonging to an associated signal shifting system, and when said normal shift register is not performing a normal shifting operation, each of said connecting sections inhibits supply of said signal output from said normal shift register and supplies a signal output from said redundant shift register to said normal and redundant shift registers of second shift register group belonging to said associated signal shifting system.

7. The shift register circuit according to claim 1, wherein each of said shift register groups and said plurality of connecting sections has a plurality of thin film transistors each having an active layer formed of a polycrystalline silicone film.

8. A display unit comprising:

a pixel cell array having a plurality of pixel cells;

a plurality of wirings connected to each of the pixel cells of said pixel cell array;

a shift register circuit having a plurality of signal shifting systems, wherein said signal shifting systems are electrically isolated from each other;

wherein said shift register circuit includes:

a plurality of shift register blocks each including a plurality of shift register groups, wherein each shift register group respectively belongs to one of said signal shifting systems;

a plurality of connecting sections respectively corresponding to said signal shifting systems, each of said plurality of connecting sections mutually connecting said plurality of shift register groups belonging to the associated signal shifting system;

wherein at least one of said shift register blacks is located between each of said connecting sections; and a plurality of sampling transistor groups corresponding to said plurality of shift register groups, said plurality of sampling transistors connected to said plurality of wirings and to a plurality of video lines to transmit video signals, and sample said video signals in response to a signal output from each of said shift register groups to transmit said video signals to each of said wirings.

9. The display unit according to claim 8, wherein each of said connecting sections comprises:

a first transmission gate, connected between a first adjacent shift register block and a second adjacent shift register block, for transmitting a first data signal from the first adjacent shift register block to the second adjacent shift register block;

a second transmission gate connected between the first adjacent shift register block and the second adjacent shift register block for transmitting a second data signal from the first adjacent shift register block to the second adjacent shift register block; and a switch circuit connected to the first adjacent shift register block and the first and second transmission gates for controlling the operation of the first and second transmission gates.

10. The display unit according to claim 8, wherein there are four signal shifting systems; and said connecting sections, each respectively belonging to a first through a fourth signal shifting systems, are arranged as four separate connecting sections in said line arrangement; with one of said shift register blocks being located between said four connecting sections.

11. The display unit according to claim 8, wherein each of said plurality of shift register groups has a normal shift register and redundant shift register each of which performs a leftward shift operation, and has a normal shift register and a redundant shift register, each of which performs a rightward shift operation.

12. The display unit according to claim 8, wherein each of said plurality of shift register groups, said plurality of connecting sections and said plurality of sampling transistors groups has a plurality of thin film transistors each having an active layer formed of polycrystalline silicon film.

13. A shift register circuit having a plurality of signal shifting systems, comprising:

a plurality of shift register blocks each including a plurality of shift register groups, wherein each shift register group respectively belongs to one of the signal shifting systems; and a plurality of connecting sections respectively belonging to the signal shifting systems, provided to mutually connect the shift register groups belonging to the associated signal shifting system, wherein a single register block is located between every two adjoining connecting sections such that an interconnect distance between the individual shift register blocks is substantially equivalent.

14. The shift register circuit according to claim 13 wherein:

each of the shift register groups in a shift register block belongs to a different one of said plurality of signal shifting systems; and each of said shift register groups comprises:

a normal register and a redundant register.

15. The shift register circuit according to claim 13 wherein:

said plurality of register groups and said plurality of connecting sections are divided equally among said plurality of signal shifting systems;

the register groups and the connecting sections belonging to one of said signal shifting systems are interconnected in a serial fashion; and each register group belonging to one of said signal shifting systems is connected to one of:

a register group belonging to the same signal shifting system, and a connecting section belonging to the same signal shifting system.

16. A shift register circuit having a plurality of signal shifting systems, comprising:

a plurality of shift register blocks each including a plurality of shift register groups, wherein each shift register group respectively belongs to one of the signal shifting systems; and a plurality of connecting sections respectively belonging to the signal shifting systems, provided to mutually connect the shift register groups belonging to the associated signal shifting system, wherein a pair of register blocks is located between every two adjoining connecting sections such that an interconnect distance between the individual shift register blocks is substantially equivalent.

\* \* \* \* \*